(12) United States Patent
Uchibori et al.

(10) Patent No.: US 7,256,738 B2
(45) Date of Patent: Aug. 14, 2007

(54) RESONANT CIRCUITS

(75) Inventors: Shinya Uchibori, Hiroshima (JP);
Takaaki Mizukawa, Hiroshima (JP);
Yoshinori Hatanaka, Hiroshima (JP)

(73) Assignee: Kabushiki Kaisha Miyake (JP)

(*) Notice: Subject to any disclaimer, the term of this patent is extended or adjusted under 35 U.S.C. 154(b) by 0 days.

(21) Appl. No.: 10/636,720

(22) Filed: Aug. 7, 2003

(65) Prior Publication Data

US 2004/0025324 A1 Feb. 12, 2004

Related U.S. Application Data

(62) Division of application No. 09/396,277, filed on Sep. 15, 1999, now Pat. No. 6,618,939.

(30) Foreign Application Priority Data

Feb. 27, 1998 (JP) .................................. 10-64465
Sep. 14, 1999 (JP) .................................. 11-260466

(51) Int. Cl.
*H01Q 1/38* (2006.01)

(52) U.S. Cl. ............................. 343/700 MS; 343/895; 29/600; 428/209; 428/458

(58) Field of Classification Search ............... 29/602.1, 29/25.35–25.42, 600, 601, 825, 831, 832, 29/605–606; 343/700 MS, 895, 572, 457; 428/209, 458, 461, 901; 340/572.2
See application file for complete search history.

(56) References Cited

U.S. PATENT DOCUMENTS

| | | | |
|---|---|---|---|
| 2,969,300 A | 1/1961 | Franz | |
| 3,913,219 A * | 10/1975 | Lichtblau | 29/592.1 |
| 4,369,557 A * | 1/1983 | Vandebult | 29/25.42 |
| 4,495,232 A | 1/1985 | Bauser et al. | |
| 4,583,099 A * | 4/1986 | Reilly et al. | 343/895 |
| 4,717,438 A | 1/1988 | Benge et al. | |
| 4,797,785 A | 1/1989 | Jorgenson | |
| 4,818,312 A | 4/1989 | Benge | |
| 4,846,922 A | 7/1989 | Benge et al. | |
| 4,900,386 A | 2/1990 | Richter-Jorgensen | |
| 4,910,499 A | 3/1990 | Benge et al. | |
| 5,006,856 A | 4/1991 | Benge et al. | |
| 5,059,950 A | 10/1991 | Perchat | |
| 5,119,070 A * | 6/1992 | Matsumoto et al. | 340/572.5 |
| 5,170,544 A * | 12/1992 | Pichl | 29/25.42 |
| 5,174,847 A | 12/1992 | Pichl | |
| 5,184,111 A | 2/1993 | Pichl | |
| 5,355,593 A | 10/1994 | Kotitschke | |
| 5,358,591 A | 10/1994 | Candore | |
| 5,589,251 A | 12/1996 | Imaichi et al. | |

(Continued)

FOREIGN PATENT DOCUMENTS

EP 0 142 380 5/1985

(Continued)

*Primary Examiner*—Minh Trinh

(57) ABSTRACT

A resonant circuit having a circuit coil formed on each surface of a dielectric film. Each coil has a line-width and an outer periphery in which the line-width of each circuit is 1/50 or more of the length of the outermost periphery of that circuit. Each coil has at least three complete turns, and the coils are provided on the faces of a dielectric film in such a manner that the coils are faced to each other.

5 Claims, 7 Drawing Sheets

U.S. PATENT DOCUMENTS

| | | | |
|---|---|---|---|
| 5,645,932 A * | 7/1997 | Uchibori | 428/347 |
| 5,915,648 A | 6/1999 | Madrzak et al. | |
| 6,007,659 A | 12/1999 | Hasegawa | |
| 6,136,142 A | 10/2000 | Kitagawa et al. | |
| 6,214,444 B1 * | 4/2001 | Uchibori | 428/209 |
| 6,383,616 B1 * | 5/2002 | Uchibori | 428/209 |
| 6,458,465 B1 * | 10/2002 | Uchibori | 428/458 |
| 6,618,939 B2 * | 9/2003 | Uchibori et al. | 29/846 |
| 6,680,702 B2 * | 1/2004 | Yde-Andersen et al. | 343/700 MS |

FOREIGN PATENT DOCUMENTS

| | | |
|---|---|---|
| EP | 0 316 847 | 11/1987 |
| EP | 0 285 559 | 5/1988 |
| EP | 0 340 670 | 4/1989 |
| EP | 0665705 | 12/1994 |
| GB | 2211702 | 7/1989 |
| JP | 52-8081 | 7/1975 |
| JP | 4-344237 | 11/1992 |
| JP | 5-147819 | 6/1993 |
| JP | 2001-84463 | 3/2001 |
| WO | 9221113 | 11/1992 |

* cited by examiner

RESONANT CIRCUITS

CROSS-REFERENCE TO RELATED APPLICATIONS

This application is a divisional of U.S. application Ser. No. 09/396,277, filed Sep. 15, 1999 now U.S. Pat. No. 6,618,939, which claims priority to Japanese Application No. Hei 11-260466, filed Sep. 14, 1999 and is also related to Japanese Patent Application No. Hei 10-64465 filed Feb. 27, 1998, which applications are incorporated herein by reference.

BACKGROUND OF THE INVENTION

1. Field of the Invention

The present invention relates to a process for producing a resonant tag equipped with a resonant frequency circuit which resonates with a radio wave transmitted at a particular frequency from a detector.

2. Description of the Related Art

As is well known, resonant tag is a tag equipped with a resonant circuit which resonates with a radio wave transmitted at a particular frequency. Thus, when the resonant tag is brought into an area in which the radio wave of the particular frequency is transmitted, the resonant tag readily reacts to operate a buzzer or an alert lamp of a detector. Thus, to avoid shoplifting, the resonant tags are attached to goods and the like in department stores, discount stores, rental shops for video tapes, compact disk (CD) shops, etc.

Basically, a resonant tag is composed of a plastic film (as a dielectric), having a spiral (or a coil-shaped) circuit (hereinafter referred to as a "coil circuit") on at least one face of the film, and a circuit for use as an electrode plate of a capacitor or another coil circuit which functions also as a capacitor on the other face of the film. If necessary, the resonant tag is laminated on a sheet of a base material such as a paper.

In addition to a resonant tag above, there is also proposed a resonant tag having no capacitor electrode section formed on the end portion of the coil circuit. In the proposed structure, coil circuits are formed on both faces of a plastic film in correspondence with each other to utilize the circuit itself as the capacitor electrode plate.

The following processes have been known as processes for producing a resonant tag and the like. In one process, the following steps are carried out. A metal foil such as an aluminum foil is laminated on a plastic film. A photosensitive resin is applied to a face of this metal foil. A negative film-having a predetermined circuit pattern is placed on the resin-coated face and is photosensitized. Non-photosensitive portion is developed and removed, and the exposed metal foil is then etched and removed, to form a circuit. In another process, the following steps are carried out. A metal foil is stamped out by a die stamp having a blade with a predetermined shape, to form a circuit, and the metal foil is thermally adhered to a base sheet (a sheet of abase material) at the same time when the stamping is conducted.

The present invention relates to an improvement of die stamping in the foregoing processes.

In the die stamping process, die must stamp out a metal foil that is formed into a roll while tine metal foil being rewound, and thermally adhere the metal foil to a base material, for the continuous working. Thus, the die stamping is applicable to laminate a metal foil with strength to some degree on a solid base material, whereas the die stamping is not so advantageous for other cases. Therefore, the die stamping is suitable for a printed circuit board using a relatively thick copper foil and including a phenol resin plate as a base material, etc.

A resonant tag is basically disposable and formed into a thin label, so that the resonant tag mainly adopts a reasonable thin aluminum foil as a metal foil, and a soft plastic film or paper as a base sheet. Thus, that aluminum foil may be broken or the base sheet may be also stamped out during stamping out or transferring the foil, so that the resonant tag using the die stamping has not been put into practical use in the current state.

In order to solve these problems, such a process is attempted that a metal foil is laminated on a carrier sheet which has thick thickness and a stamping die only stamps out the metal foil to transfer this metal foil onto a plastic film (as a dielectric) or a base sheet. However, this process has such problems as (1) the additional step of laminating the metal foil on the carrier sheet is required; (2) the metal foil and the carrier sheet must be separated with difficulty; (3) when the stamped-out shape is discontinuous such as round, the separation between the stamped-out portion and the non stamped-out portion is difficult; and the like.

SUMMARY OF THE INVENTION

The present invention is intended to provide a process for continuously producing a resonant tag using the die stamping.

The present invention will be described taking a resonant tag as an example. However, of course, the present invention is not to be limited to the resonant tag, but can be applied to a production of goods similar thereto.

The present invention provides a process for producing a resonant tag, wherein a metal foil having a thermal adhesion adhesive applied to at least one face thereof is stamped out into a circuit-like shape and is adhered to a base sheet, the process comprising: stamping out the metal foil into a predetermined shaped metal foil portion while being passed through a die roll having, at its roll face, a stamping blade with a predetermined shape and a transfer roll in contact with the die roll which functions also as a die bearing roll or back-up roll; holding the resultant metal foil portion obtained by the stamping-out operation onto the surface of the transfer roll by suction holes formed in the transfer roll; and thermally adhering the metal foil portion obtained by the stamping-out operation to the base sheet in contact with the transfer roll at its another face (i.e., another face of the transfer roll) by an adhesive roll in contact with the transfer roll through the base sheet.

Further, according to the present invention, in the above-described process, as the adhesive roll is used an adhesive roll having protrusions thereon so as to correspond in shape to metal foil portions obtained by the stamping-out operation which is to be transferred.

Still further, according to the present invention, the above-described process is characterized in that a second transfer roll having protrusions thereon is provided between the transfer roll and the adhesive roll so as to correspond in shape to metal foil portions obtained by the stamping-out operation which is to be transferred, and the resultant metal foil portions obtained by the stamped-out operation are transferred from the transfer roll to the protrusions on the second transfer roll, and is then thermally adhered to the base sheet running between the second transfer roll and the adhesive roll. In this process, the second transfer roll is formed with suction holes to hold the metal foil as is the case of the first transfer roll.

Still further, the present invention intends to provide resonant tags which can be readily manufactured and which have stable resonant characteristics.

BRIEF DESCRIPTION OF THE DRAWINGS

In the accompanying drawings.

DESCRIPTION OF THE PREFERRED EMBODIMENTS

Figure 1:
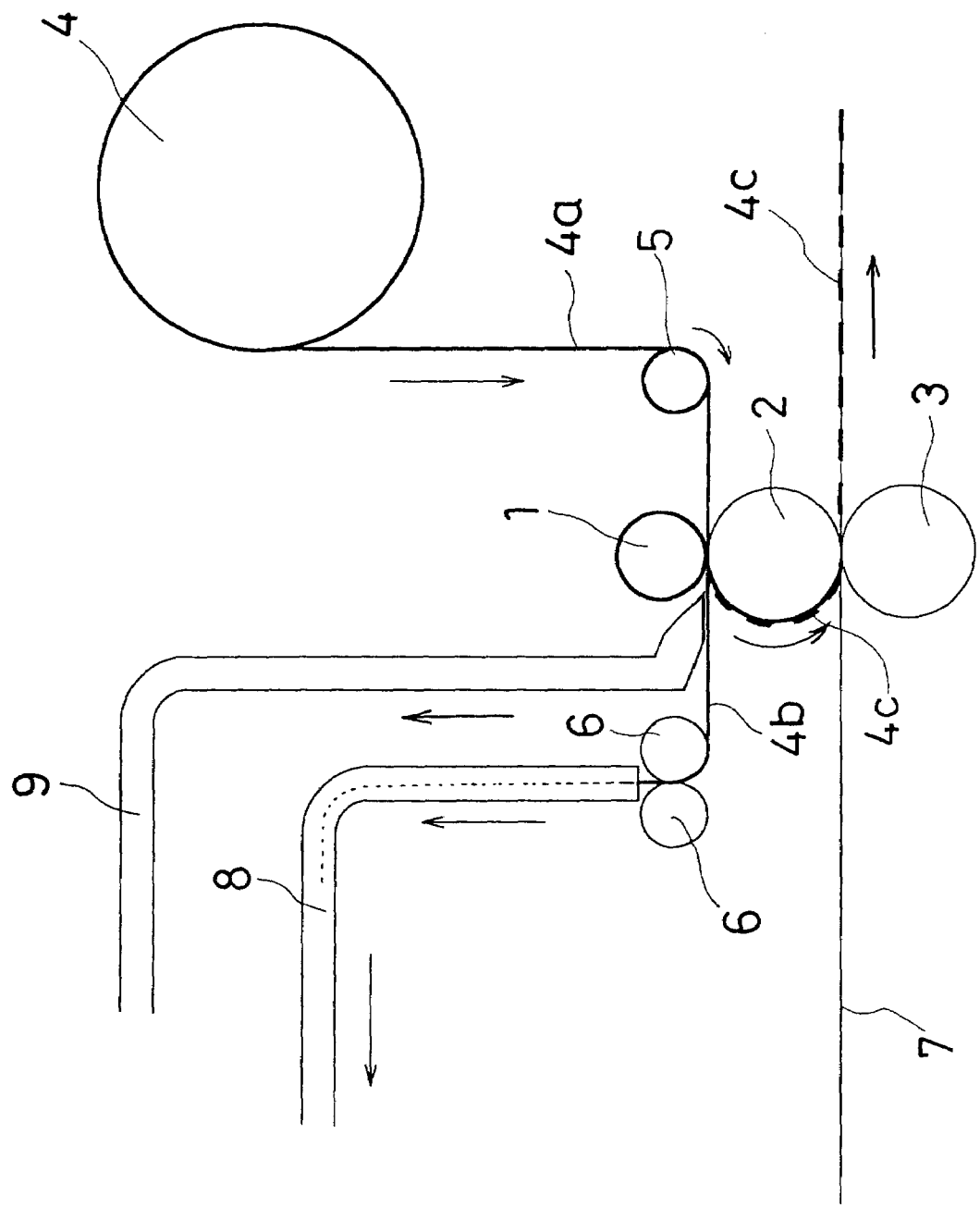
FIG. 1 is a schematic view showing a process for illustrating one embodiment of the present invention.

A metal foil used in the present invention is to be thermally adhered to a base sheet after being stamped out into a predetermined shape. Basically, a metal foil is used where an adhesive having thermal adhesive property (hereinafter referred to as a "thermal adhesion adhesive") is applied to at least one face of the foil. Such a commonly known thermally adhesive resin can be used as the thermal adhesion adhesive including vinyl chloride resin, vinyl acetate resin and acrylic resin.

The thickness of the thermal adhesion adhesive to be applied is not particularly limited, but is generally about 1 to 3µ (micron), preferably about 1 to 2µ. The thermal adhesion adhesive can also function to reinforce the metal foil.

Surface-coating may be applied to the other face of the metal foil by using resin, if necessary. The resin and the like to be applied thereto can be the one for simply protecting a surface, or the one for facilitating further processes. Otherwise, a thermal adhesive coating and the like having higher temperature thermal adhesion than that of the above thermal adhesion adhesive may be provided.

The metal foil having a thickness to the extent that it may not be broken with tension exerted on the metal foil is generally used in this process. However, a thinner metal foil can also be used together with a carrier sheet. In this case, the carrier sheet is not adhered with the metal foil but is simply placed thereon. The carrier sheet is then stamped out together with the foil. The force sucking from the suction holes formed in the transfer roll is acted on the metal foil through this sheet, so that the carrier sheet and the metal foil are both held onto the surface of the transfer roll. Accordingly, the carrier sheet is desirably a paper having air-permeability. After the metal foil has been adhered with the base sheet, this carrier sheet may be advantageously removed in a manner such as blow-off with air.

The metal foil having a thickness of about 50µ is preferable in view of workability, more preferably 20-60µ, specifically 30-50µ.

According to the present invention, the transfer roll serves as a die back-up roll when the die roll stamps out the metal foil. The transfer roll also serves to hold the stamped metal foil portions thereto and to adhere the stamped metal foil portions to the base sheet in contact with the transfer roll at its another face. According to the present invention, to hold the stamped metal foil portions onto the face of the roll, a large number of suction holes are formed in the transfer roll corresponding in shape to the stamped metal foil portions. Then, the stamped foil portions will be sucked and held by the force sucking from these holes.

Since the surface of the transfer roll serves to bear the die blade, it is advantageously formed with resilient layers such as layers made of synthetic rubber such as polyurethane or plastic layers. The layers are preferably fluorine plastic layers or the like having heat resistance, low heat conductivity, and excellent peeling-off property to meet such conditions as an ability of resisting heat when the metal foil is thermally adhered to the base sheet, an ability of not transferring heat to the roll itself from the adhesive roll, and an ability of peeling off the roll from the metal foil.

The suction operation from the suction holes in the transfer roll may be carried out in such a manner that an air is always sucked from inside of the roll, without any use of special structure, or with any use of special structure.

The suction holes at the face where the metal foil is not held during the use of the transfer roll may be closed with any member in a sliding contact with the outer surface of the roll. Alternatively, a partition or the like is formed within the transfer roll so that no suction force can act on the suction holes. A built-in valve set in such a manner that the holes are closed when the sucking force strongly acts on the suction holes may be provided.

The adhesive roll is used to thermally adhere the stamped metal foil portions to the base sheet. The thermal adhesion may be carried out in either way. That is, while the adhesive roll itself is used as a heat roll, the foil portions are adhered with heat of this roll. As another way, the foil portions are adhered by pressing between the transfer roll and the adhesive roll with a hot air being blown to the metal foil or with the metal foil being heated with an infrared lamp, etc.

When the stamped metal foil portions is adhered to a flat base sheet, an adhesive roll having no irregularity thereon is normally used.

When the metal foil is thermally adhered by heat of the adhesive roll, sometimes, the transfer roll is heated due to heat transfer from the adhesive roll, prohibiting the foil from being stamped out. In order to avoid this, advantageously, the adhesive roll formed thereon with protrusions so as to correspond in shape to the stamped metal foil portions is used to thermally adhere the metal foil at the protrusions through the base sheet.

The adhesive roll is normally made of metal, but the adhesive roll having the protrusions at which metal is exhibited and the remainder surface lined with heat-resistant rubber, etc. to reduce the irregularity may also be used. In this connection, the heat-resistant rubber, etc. may be the one that is compressed when the roll is pressed.

Like the stamped foil portions, the protrusions formed on the roll may be of a spiral shape with a slightly wider width when the stamped foil portion is of a square shape. It can also be square so as to include this spiral shape.

If a base sheet to which a circuit-like metal foil has been already adhered is used to adhere a second circuit-like metal foil onto the face of the first circuit-like metal foil, the roll having a flat surface such as the transfer roll and/or the adhesive roll sometimes does not contribute to good adhesion.

In order to overcome such circumstances, a roll having protrusions thereon is advantageously used for the transfer roll and/or the adhesive roll. The protrusion transfer roll can have a similar structure to that of the protrusion adhesive roll as described above, except that suction holes are formed therein.

The protrusion transfer roll is often troublesome to be used as a die back-up roll for the die roll in that the stamping die and the protrusions must be aligned with each other, etc. Therefore, it can be used, in addition to a first transfer roll which functions also as a die back-up roll, as a second transfer roll in contact with the first transfer roll. The second transfer roll is also formed therein with suction holes like the first transfer roll.

As is apparent from the foregoing description, according to the present invention, the metal foil that has been stamped out by the die roll is sucked and held to the transfer roll to be thermally adhered to the base sheet in contact with the transfer roll at its another face. This structure has a large number of advantages such as no damage to the base sheet, and no requirement of expensive carrier sheet. Besides, the stamped metal foil portions can be individually sucked and held to the transfer roll in an independent manner, so that no specific attention must be paid to the shape of the stamped-out portions.

As shown in FIGS. 4A to 4D, according to the present invention, in particular, a resonant tag A formed in such a manner that two coil-shaped metal foils 41, 42 are adhered with each other by thermal adhesion adhesive (thermal adhesive) layers 51, 52 which function also as dielectric layers can be readily fabricated without any use of dielectric sheet. The thermal adhesive layers 51, 52 are in advance applied to the metal foils 41, 42, and the metal foils 41, 42 arc adhered with each other by thermal adhesion, to form a resonant circuit while the both metal foils are electrically conductive in part. In FIG. 4D, reference numeral 43 indicates a conductive section.

FIG. 4A shows coil-shaped metal foils made by applying the thermal adhesion adhesive to the metal foils 41, 42, as indicated by reference symbols $4c_1$, and $4c_2$. FIG. 4B is an exploded perspective view of FIG. 4A. FIG. 4C shows the state where the coil-shaped metal foils $4c_1$, $4c_2$ arc adhered with each other. FIG. 4D particularly shows the conductive section 43.

It will be understood that the base sheet used in the present invention is in general formed of a paper used for a tag or label, but can be also formed of a plastic film (as a dielectric) or a resin-impregnated paper.

Preferred embodiments of the present invention will be hereinafter described with reference to the accompanying drawings. However, the present invention should not be limited to these embodiments.

FIG. 1 shows an embodiment of the principle process of the present invention. Reference numeral 1 denotes a die roll, reference numeral 2 does a transfer roll, and reference numeral 3 does an adhesive roll. In practical use, a metal foil 4a having thermally adhesive resin applied thereto is rewound from a rolled foil 4 that is wound with the foil. The metal foil is then fed between the die roll 1 and the transfer roll 2 through a guide roll 5, where it is stamped out into a predetermined shape. Stamped metal foil portions 4c are held onto the surface of the transfer roll 2 by suction holes (not shown) formed in the roll 2, and then adhered to a base sheet 7 running on the adhesive roll 3 in contact with the lower face of the transfer roll 2 in position.

In the present embodiment, the transfer roll 2 and the adhesive roll 3 both have smooth roll faces. The adhesive roll 3 is a metal heat roll (a heating roll).

Unnecessary metal foil portion 4b after the foil has been stamped out by the die roll 1 is ejected by a vacuum air to outside of the system through a discharging duct 8. In this figure, reference numeral 9 denotes a vacuum duct for sucking and removing fine pieces and the like that may be produced during the stamping-out operation.

Figure 2:
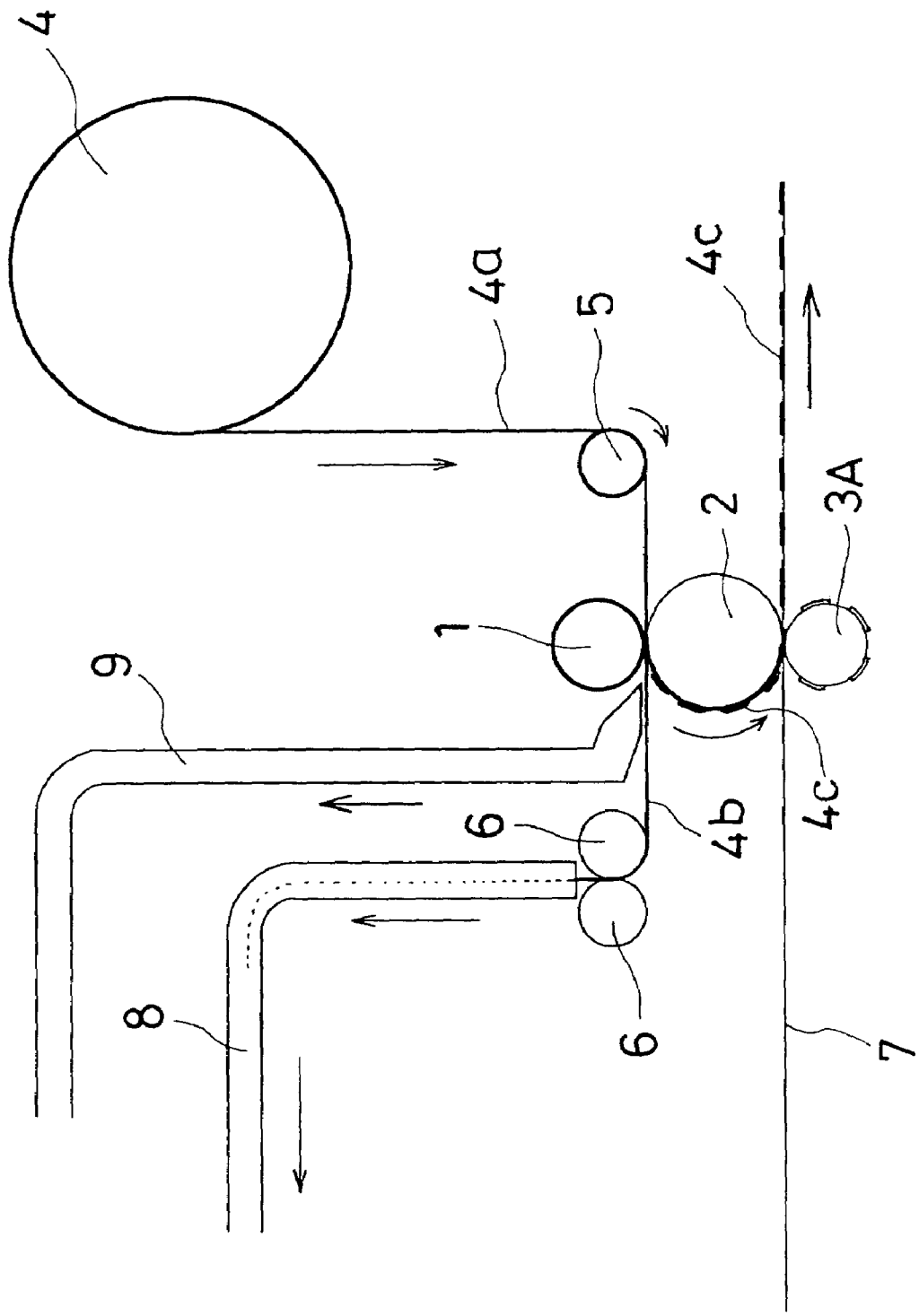
FIG. 2 is a schematic view showing a process for illustrating another embodiment of the present invention.

FIG. 2 shows another embodiment of the present invention in which a protrusion adhesive roll 3A is employed instead of the adhesive roll 3 described in the previous embodiment shown in FIG. 1. Other structures are the same as those shown in FIG. 1.

According to this modification, in the case where the adhesive roll is a heating roll, an unsuccessful stamping-out operation for the foil 4a which is caused by the fact that heat is transferred to the transfer roll 2 and the die roll 1 is also heated can be prevented. Besides, the roll having the protrusions thereon may ensure a pressing force during the adhesion. Therefore, it is suitable to adhere the stamped foil portions 4c in this step to that metal foil on the base sheet which has been already adhered with the previously stamped foil portions.

Figure 5:
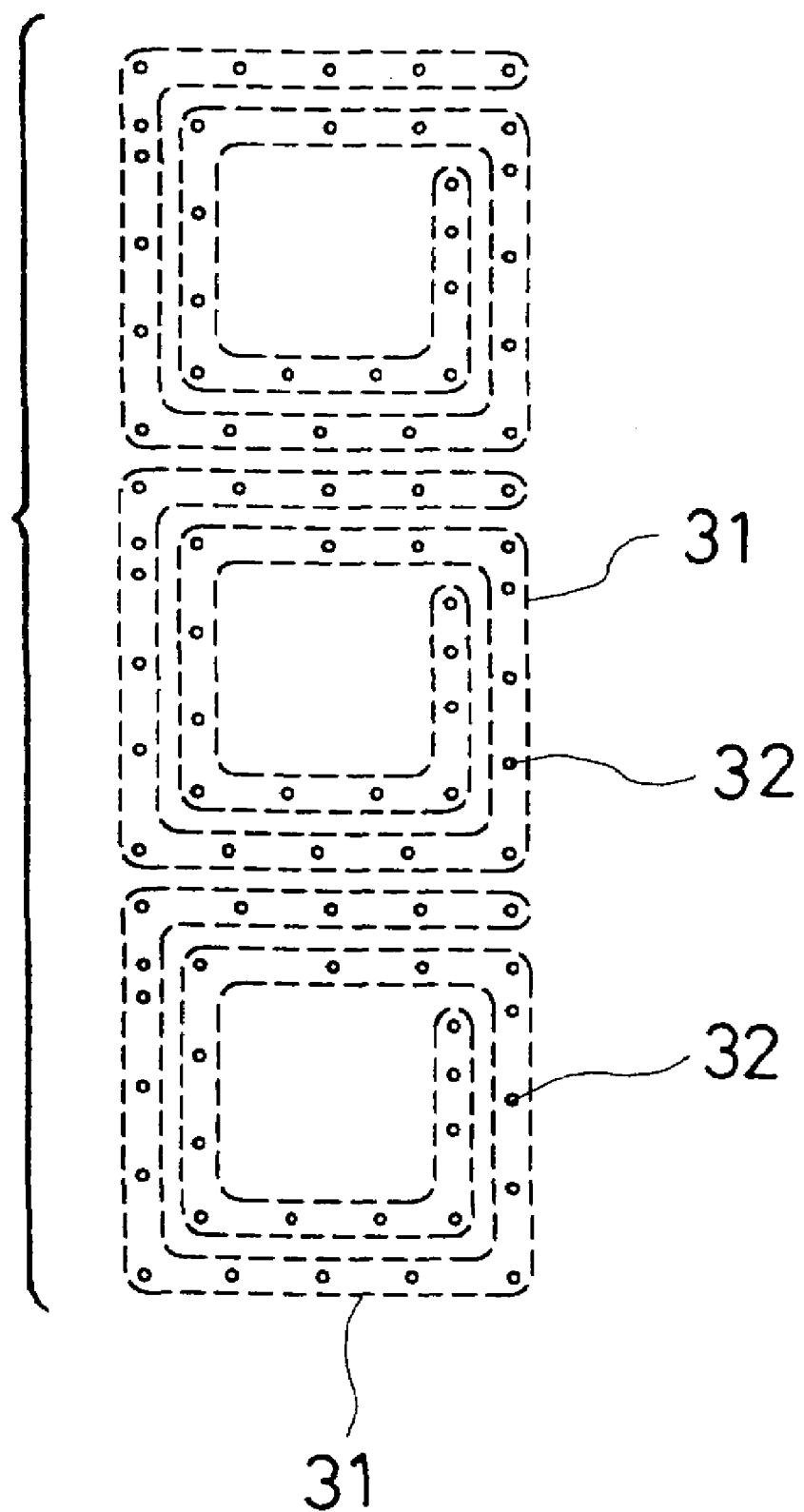
FIG. 5 is a top plan view showing an example of an arrangement of suction holes provided on a roll surface.

FIG. 5 shows an example of an arrangement of suction holes formed in the transfer roll and protrusions formed on the protrusion roll. FIG. 5 is a partial developed view showing the roll. In this figure, broken line 31 indicates a contour of the metal foil to be stamped out, and an appropriate number of suction holes 32 are formed inside surrounded by the broken line 31. The protrusions each having slightly wider than the spiral (or coil) shape indicated by the broken line 31 may be spirally formed on the surface of the transfer roll or the adhesive roll. The protrusions may be formed into a square shape so as to include this spiral shape.

Figure 3:
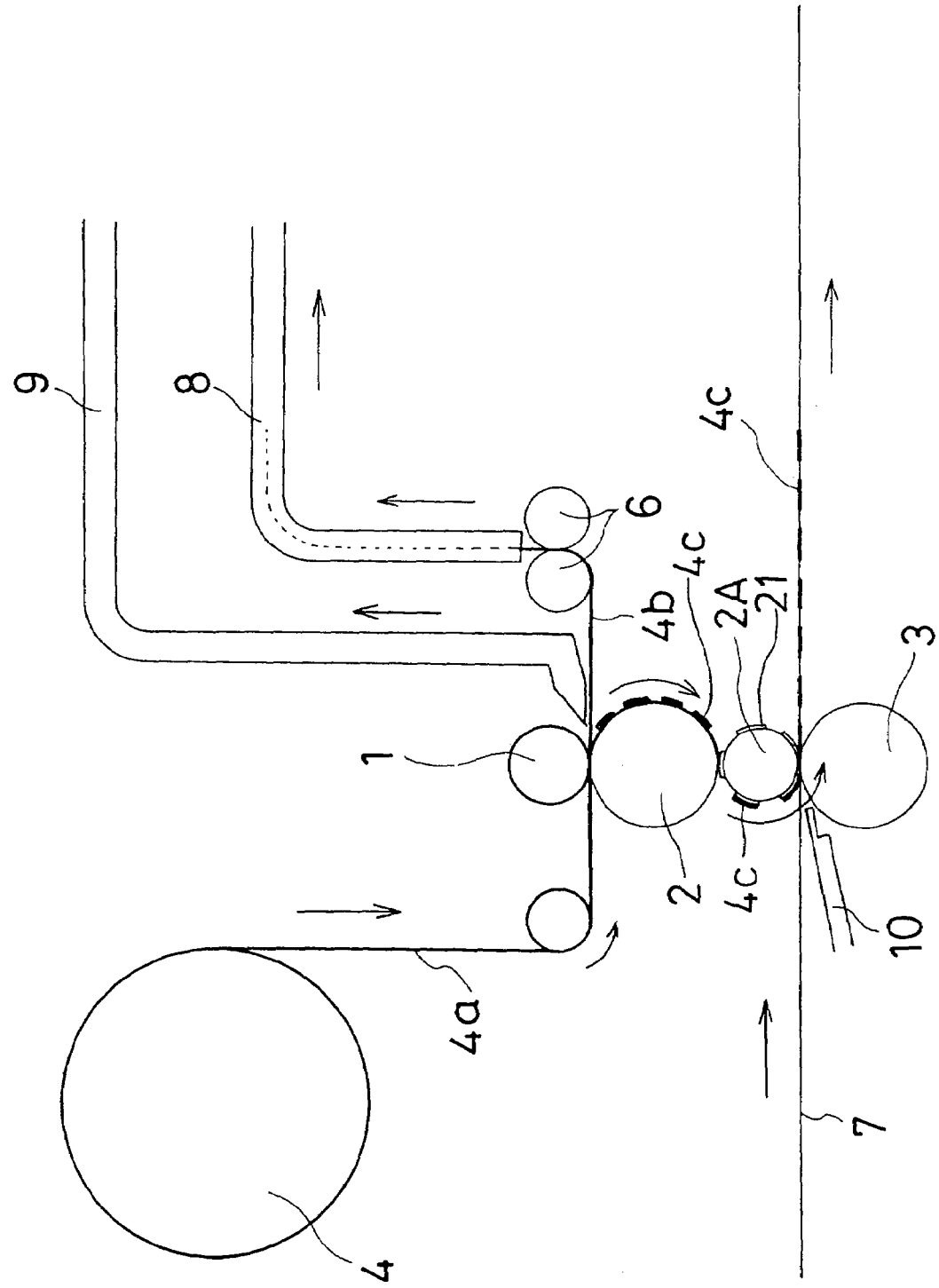
FIG. 3 is a schematic view showing a process for illustrating still another embodiment of the present invention.

FIG. 3 shows another embodiment of the present invention in which a protrusion transfer roll 2A is inserted between the transfer roll 2 and the adhesive roll 3. Other structures are the same as those shown in FIG. 1, so that identical reference numerals are given, an explanation being omitted on the remaining members.

According the present embodiment, by a provision of a second transfer roll 2A having protrusions thereon, heat from the adhesive roll 3 is hardly further conducted to the transfer roll 2 and the die roll 1. In addition, the stamped foil portions 4c can be surely adhered to the base sheet 7 having irregularity, as is the case of FIG. 2.

In this embodiment, if necessary, the protrusion adhesive roll 3A shown in FIG. 2 can also be used. Incidentally, reference numeral 10 indicates a hot-air ejection nozzle for preliminarily heating the base sheet 7 and the adhesive roll 3. The preliminary heating with the hot air will be particularly useful for the roll 3 to thermally adhere the metal foil previously adhered to the base sheet. This exhibits such an effect as an improvement of productivity.

The relationship of a capacitance (C), an inductance (L) and resonant frequency (f) in the resonant circuit is shown by the following formula (I).

$$L=1/(4\pi^2 f^2 C) \tag{I}$$

L is an inductance in a circuit-like coil and the shape of the circuit-like coil is dependent on the resonant frequency f. As derived from the formula (I), the resonant frequency f is in inverse proportion to a square root of the product of the capacitance (C) and the inductance (L) and therefore, it is required to make the inductance (L) great so as to make the resonant frequency f small. In general, inductance (L) in a circuit-like coil has been dependent on the number of winding the circuit-like coil and the outer dimension of the circuit-coil. Thus, it has been considered that the more the number of winding the coil is much and the more the diameter of the coil is large, the more an inductance which is great can be obtained. For this reason, a desired resonant frequency has been obtained by increasing the number of winding a circuit-like coil.

Figure 7A:
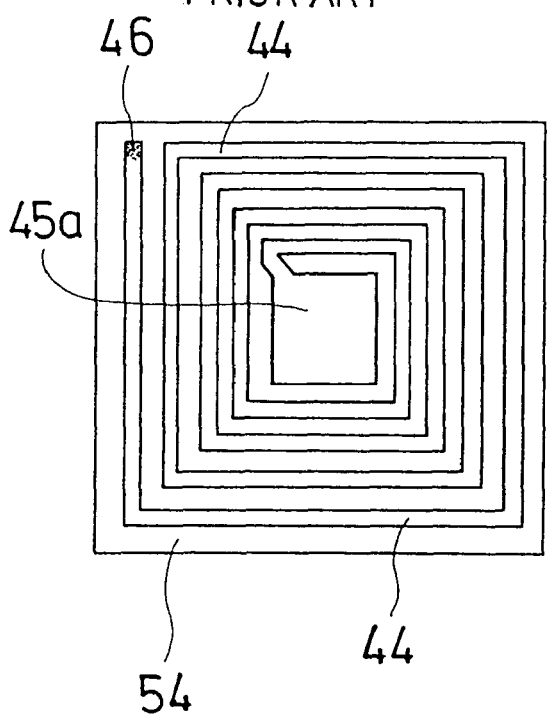
FIG. 7A and FIG. 7B are plan views showing the surface and back face of one example of the conventional resonant tag.
Figure 7B:
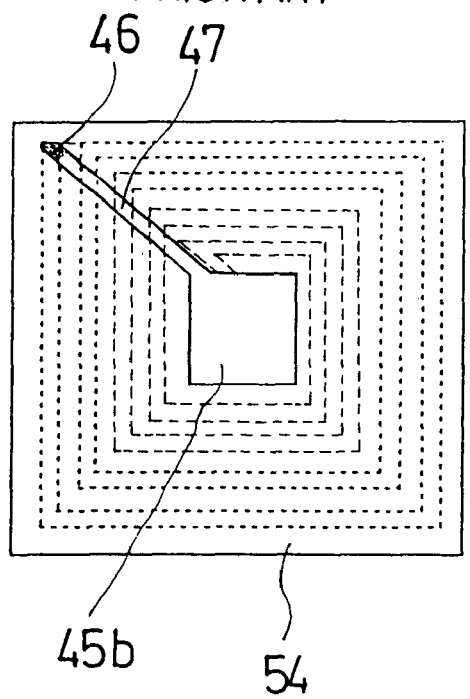

In the conventional resonant tag, for example, as shown in FIG. 7A, a circuit-like coil 44 in which the line width of the coil and the distance between neighboring lines of the coil are made thin in a narrow area is provided so as to surround a capacitor portion 45a. FIG. 7A shows a face (surface) on which the circuit-like coil 44 of the resonant tag is provided. FIG. 7B shows a reverse face of the surface shown in FIG. 7A. In FIGS. 7A and 7B, reference numeral 54 shows a plastic film, reference numeral 47 shows a circuit for the capacitor, reference numeral 46 shows a circuit-connecting terminal area and reference numerals 45a and 45b show the capacitor portion.

The plastic film 54 takes roles of a substrate on which the circuit like coil 44 is provided and of a dielectric by positioning between the capacitor 45a at the surface and the capacitor 45b at the reverse face. The circuit-like coil 44 at the surface of the plastic film 54 and the circuit 47 for the capacitor 45b on the both faces of the plastic film 54 are connected by the circuit-connecting terminal area 46, whereby forming a resonant circuit.

As explained above, the conventional resonant tag is provided with circuit-like coil which has great number of winding on one face (surface) of a dielectric film.

In the conventional resonant tag, in a case that resonant frequency is 8.2 MHz and the size of the tag is 40×40 mm, the average line-width of a circuit like coil to the length of the most outer periphery of the circuit-like coil is 1/150 or less of said length and the number of winding the coil is made round about seven times.

The circuit like coil is normally formed by a method for etching a metal foil such as aluminum foil, copper foil, etc. or a Method for applying an electrically conductive coating containing metal powder of these aluminum, copper, etc. In these methods, however, there have been cases that when the thickness (line width) of a circuit-like coil is thin or when the distances between the neighboring lines becomes narrow, the lines are burnout or the lines are connected to each other at the manufacturing step or the lines connected to each other, resulting in producing inferior circuits. These defects have been also generated at the secondary processing step after the formation of the circuit and therefore, much cares have been necessary in obtaining resonant tags having stable resonant characteristics.

In order to solve the above-described defects, the present invention provides the resonant tags which can be readily manufactured and which have stable resonant characteristics.

The resonant tags of the present invention are characterized in that at least two circuit-like coils in which the line-width of each circuit is 1/50 or more to the length of the most outer periphery of each circuit and the number of winding the coil is made round three times or less are provided on the both faces of a dielectric film in such a manner that the both circuit-like coils are faced to each other.

In the present invention, the circuit-like coil may be formed by using a metal foil such as aluminum foil, copper foil, etc. or may be formed by the application of an electrically conductive coating containing these metal powder. It is preferable to form the circuit-like coil by using metal foils.

By adhering the circuit-like coils on the both faces of the dielectric film so as to be faced to each other, a capacitor is formed by a portion at which the both circuit-like coils are faced to each other by sandwiching the dielectric film. Said capacitor takes a role of a capacitor which is provided in the conventional resonant tag. By the constitution of the resonant tag according to the present invention, there is no necessity of separately providing a capacitor portion at the terminal or the center of the coil.

As the dielectric film, plastic films, resin films or coated resin film may be used. The two circuit-like coils which are to be adhered on the both faces of the dielectric film are adhered in such a manner that the directions where the coils are wound are different to each other, and the circuit-like coils at the both faces of the dielectric film are connected at the circuit-connecting terminal area which is positioned at the ends of the coils, whereby forming a resonant circuit. (see FIG. 4D).

As an index which shows a performance of the resonant circuit, Q value (strength of resonance) is used. The Q value is shown by the following formula (II).

$$Q = 2\pi f L/R \qquad (II)$$

In the formula (II), R represents a resistance value, f represents a resonant frequency and L represents an inductance.

It has been popular view that the more resonant circuits have high Q value, the more such resonant circuits are excellent. In a case that the resonant circuits having higher Q value is used in data communication, electric supply and existence-recognition in which resonant phenomenon is utilized, system having high efficiency and high environmental resistance can be performed.

By making the thickness of the coil portion (line width of the coil) thick, it is possible to keep the resistance value of the line roots low. Further, the length of the coil becomes short and therefore, the resistance value at the portions of the coil can be made low.

In the conventional one-face coil in which the coil-extension is thin and long, it has been required to use a copper foil or gold-plated copper foil which has high conductivity (low resistance value) so as to form a resonant circuit having high performance. By the techniques of the present invention, it becomes possible to use a metal foil such as aluminum foil, etc. which is not expensive and has good workability while retaining the performance and to use thin metal foils. Moreover, since the thickness of the line width of the coil is thick, the method of producing the resonant tags of the present invention, i.e., a method for stamping out the metal foil into a coil-form and a method for suctioning and transferring the stamped metal foil can be readily carried out.

In a case of the both-face coils according to the present invention, the inductance L is reduced by shortening the length of the coil. On the other hand, since the line-width of the coil becomes thick, the resistance value R is reduced.

As a result, it is possible to retain or increase the Q value according to the structure of the both-face coils in which the reducing ratio of R is larger in comparison with the reduction ratio of L.

EXAMPLE AND COMPARATIVE EXAMPLE

Size of resonant tag: 40×40 mm (dimension which becomes an outer periphery of the circuit)
Resonant frequency: 8.2 MHz Under the above-mentioned conditions, the resonant tag of the present invention (Example) and the conventional resonant tag were manufactured and the performances of the manufactured resonant tags were compared.

The resonant tag of the Example is a resonant tag of the both-face coil type as shown in FIG. 4D. The Comparative Example is a resonant tag in one-face coil type as shown in FIG. 7.

The constitutions and properties are shown in Table 1.

TABLE 1

|  | Comparative Example | Example |
|---|---|---|
| Coil |  |  |
| material | aluminum foil | aluminum foil |
| thickness (surface/back) | 50 μm/10 μm | 40 μm/40 μm |
| number of winding | 8 | 2/1 (surface/back) |
| Dielectric |  |  |
| capacitor | 20 μmPE film | 3 μm coated resin film |
| area/volume | 121 mm$^2$/123 pF | 727.3 mm$^2$/4937 pF |
| L (inductance) | 3.06 μH | 0.154 μH |
| Length of coil | 980 mm | 284 mm |
| Coil resistance | 0.6860 Ω | 0.03976 Q |
| Q calculated value | 230 | 199 |
| found value | 58 | 60 |

As shown in Table 1, the resonant tag of the present invention has the similar resonant strength to that of the conventional resonant tag in spite that the number of winding coil is less.

Figure 6:
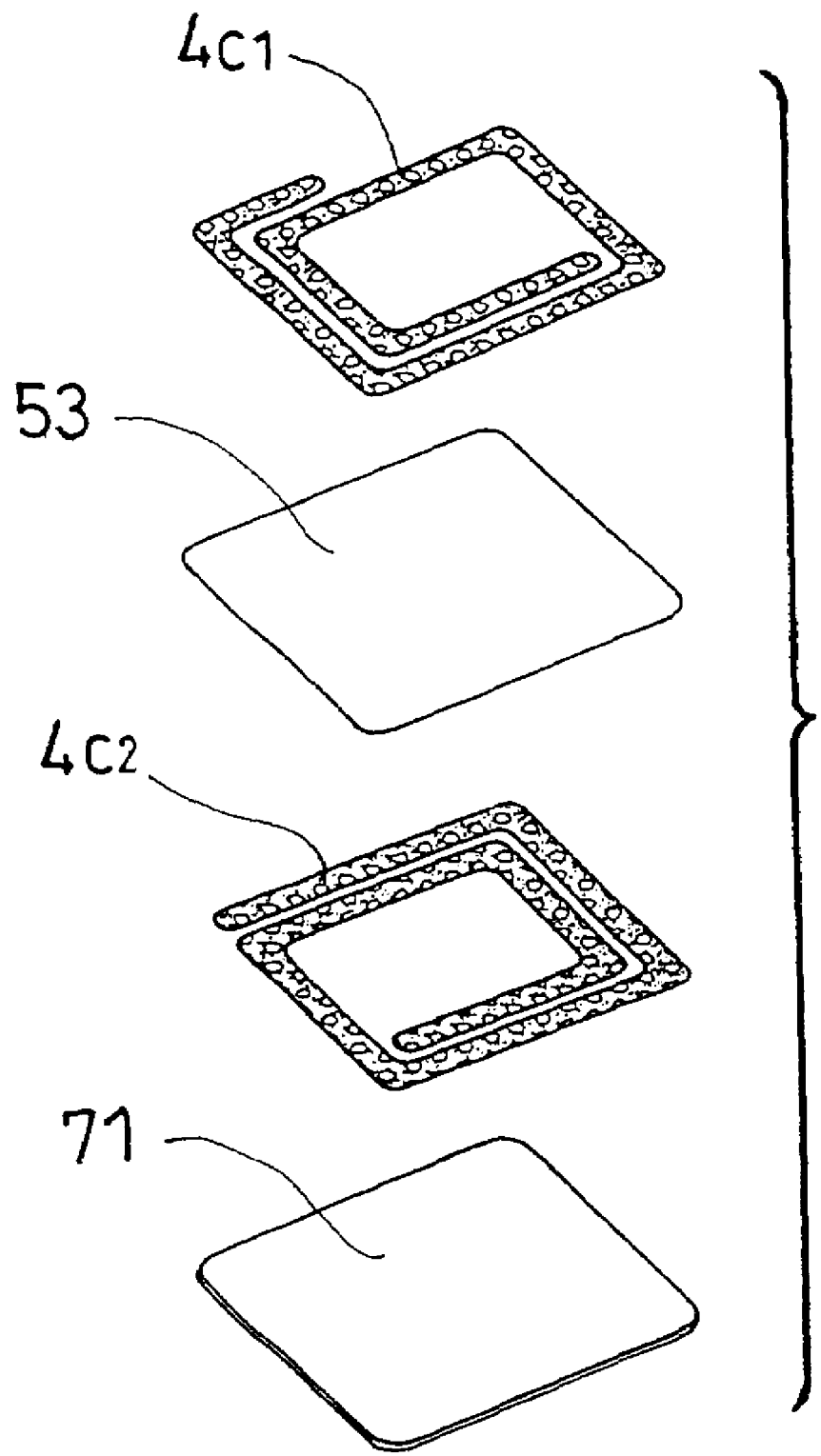
FIG. 6 is an exploded perspective view showing one example of the present invention.

FIG. 6 is an exploded perspective view showing the constitution of the other Example of the resonant tag according to the present invention. The coil-shaped metal foils $4C_1$, $4C_2$ which are stamped out by the method of the present invention are adhered to the both faces of a dielectric sheet 53 and then, they are adhered to a base sheet 71.

In the constitution of FIG. 6, when thermal adhesive film such as polyethylene film is used as the dielectric sheet 53, the metal foils 41, 42 in coil-shape in which a thermal adhesion adhesive is not coated can be used. As the base sheet 71, a thick paper, paper board, etc. the face of which is provided with beautiful printing can be used.

Figure 4:
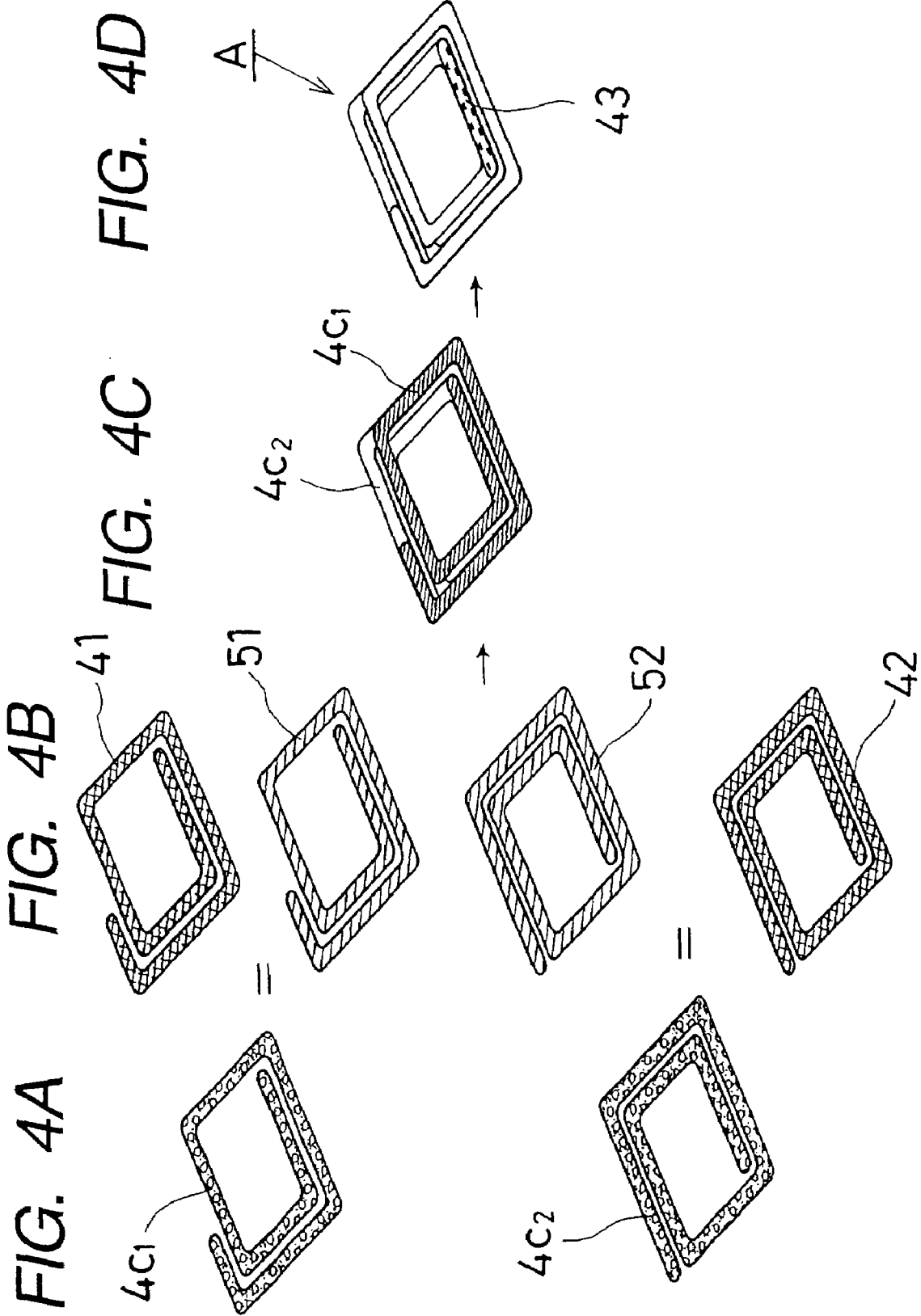
FIGS. 4A to 4D are perspective views showing an example in the structure of a resonant tag.

The resonant circuit of the present invention take a role of the conventional capacitor by connecting the lines of the coils at the surface and back face. On top of this role, since the line width of the coil is thick, the volume of capacitor can be easily adjusted and resonant frequency can be changed by slightly moving the connected face of the coils at the both faces or by changing the size of the conductive section 43 as shown in FIG. 4.

Although the present invention is explained by mainly referring to the resonant tag, it can be used as IC tag or IC card by the incorporation of IC chip.

Although the IC chip has a specific capacitance, each chip has variance in capacitance. This variance renders the resonant frequency of IC tag or TC card to be varied when the IC chip is provided in the resonant circuit.

As apparent from the Table 1, the Comparative Example obtains resonant frequency by a small volume (123 pF) with respect to a large L (inductance) and therefore, the variance of capacitance of IC chip renders the variance of the resonant frequency of IC tag or IC card to be large.

On the other hand, since the Example of the present invention obtains resonant frequency by a large volume (4937 pF) with respect to a small L, influence of the variance of capacity of IC chip to the resonant frequency of IC tag or IC card is very less. This means that variance of the resonant frequency of IC tag or IC card which uses the resonant circuit of the present invention is very less, In a case that IC chip is mounted in the resonant circuit, it is considered that the matching of the resonant circuit and IC chip is very important in a viewpoint of performance. Since the adjustment of the capacitance and inductance in the resonant circuit of the present invention is readily made, the impedance of the resonant circuit can be easily adjusted and the matching of the resonant circuit and IC chip is made with facility.

In the conventional resonant tag, it has been required to adjust resonant frequency by lowering the capacity volume by cutting a part of a circuit after IC chip is provided. However, the circuit of the present invention does not require such adjustment or adjustment is possible without conducting the adjustment in the conventional resonant tag.

What is claimed is:

1. A resonant tag provided with a resonant circuit having at least two circuit coils comprised of a metal foil and each having a line-width and an outer periphery in which the line-width of each circuit is 1/50 or more of the length of the outermost periphery of that circuit, the circuit including a thermal adhesive resin providing a dielectric film having opposed faces, and each coil having at least three complete turns, the coils being provided respectively on opposed faces of the dielectric film in such a manner that the coils are faced to each other.

2. The resonant tag as claimed in claim 1, wherein each circuit coil is adhered to said thermal adhesive dielectric film.

3. The resonant tag as claimed in claim 1, wherein the winding direction of the two circuit coils which are provided on the faces of the thermal adhesive dielectric film are in different directions to each other.

4. The resonant tag as claimed in claim 1, wherein the thermal adhesive dielectric film is comprised of a plastic film, a resonant film or a resin coating.

5. The resonant tag of claim 1, wherein the length of the outermost periphery of said resonant circuit is about 160 mm and the circuit coils are generally square and each measures about 40 mm by about 40 mm.

* * * * *